US009479121B2

(12) United States Patent
Wilson

(10) Patent No.: US 9,479,121 B2
(45) Date of Patent: Oct. 25, 2016

(54) INTERFERENCE SUPPRESSION FOR SWITCHED MODE POWER SUPPLY WITH ERROR CORRECTION

(71) Applicant: SNAPTRACK, INC., San Diego, CA (US)

(72) Inventor: Martin Wilson, Cambourne (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/413,960

(22) PCT Filed: Jul. 10, 2013

(86) PCT No.: PCT/EP2013/064540
§ 371 (c)(1),
(2) Date: Jan. 9, 2015

(87) PCT Pub. No.: WO2014/009399
PCT Pub. Date: Jan. 16, 2014

(65) Prior Publication Data
US 2015/0162880 A1 Jun. 11, 2015

(30) Foreign Application Priority Data
Jul. 10, 2012 (GB) .................................. 1212214.9

(51) Int. Cl.
*H03G 3/20* (2006.01)
*H03F 1/26* (2006.01)
(Continued)

(52) U.S. Cl.
CPC ................ *H03F 1/26* (2013.01); *H02M 3/04* (2013.01); *H03F 1/0227* (2013.01); *H03F 3/19* (2013.01);
(Continued)

(58) Field of Classification Search
CPC .. H03F 1/0222; H03F 1/0227; H03F 1/0233; H03F 1/0238
USPC ......................................... 330/127, 136, 297
See application file for complete search history.

(56) References Cited

U.S. PATENT DOCUMENTS 6,900,697 B1   5/2005  Doyle et al.
8,803,605 B2 *  8/2014  Fowers ................. H03F 1/0238
                                                330/127
(Continued)

FOREIGN PATENT DOCUMENTS

EP    0475835 A1    3/1992
EP    2214305 A1    8/2010
(Continued)

OTHER PUBLICATIONS

Officer: Nora Lindner, "International Preliminary Report on Patentability", dated Jan. 22, 2015, issued in counterpart International Application No. PCT/EP2013/064540.
(Continued)

Primary Examiner — Steven J Mottola

(57) ABSTRACT

A switched mode power supply arranged to provide a switched supply at one terminal of an inductor, another terminal of the inductor being connected to a first input of an error amplifier having a reference signal at a second input, the error amplifier generating a corrected switched supply at an output in dependence on the difference between signals at its first and second inputs, there being provided a feedback path between the output of the error amplifier and the first input of the error amplifier, and further comprising circuitry for sensing a switcher interference current in the feedback path of the error amplifier, and for adjusting the corrected switched supply output to reduce the switcher interference current in the output.

6 Claims, 3 Drawing Sheets

(51) Int. Cl.
  *H03F 1/02* (2006.01)
  *H03F 3/24* (2006.01)
  *H02M 3/04* (2006.01)
  *H03F 3/19* (2006.01)
  *H03F 3/217* (2006.01)

(52) U.S. Cl.
  CPC ............... *H03F 3/217* (2013.01); *H03F 3/24* (2013.01); *H03F 2200/102* (2013.01); *H03F 2200/372* (2013.01); *H03F 2200/432* (2013.01); *H03F 2200/451* (2013.01); *H03F 2200/462* (2013.01)

(56) References Cited

U.S. PATENT DOCUMENTS

2008/0258831 A1   10/2008   Kunihiro et al.
2014/0117468 A1*   5/2014   Parris ..................... G01N 27/00
                                                              257/414

FOREIGN PATENT DOCUMENTS

EP   2378657 A1   10/2011
GB   2440772 A     2/2008

OTHER PUBLICATIONS

"Related UK Application No. GB 1212214.9", "Search Report", Nov. 2, 2012, Publisher: UK IPO, Published in: UK.

"Related International Application No. PCT/EP2013/064540", "International Search Report and Written Opinon", Sep. 18, 2013, Publisher: PCT—ISA/EPO, Published in: EP.

Jinsung Choi, et al., "A Polar Transmitter with CMOS Programmable Hysteretic-Controlled Hybrid Switching Supply Modulator for Multistandard Applications", "IEEE Transactions on Microwave Theory and Techniques; ISSN: 0018-9480", Jul. 7, 2009, pp. 1676-1686, XP0112584, vol. 57, No. 7, Publisher: IEEE Service Center, Published in: Piscataway, NJ, US.

* cited by examiner

INTERFERENCE SUPPRESSION FOR SWITCHED MODE POWER SUPPLY WITH ERROR CORRECTION

BACKGROUND TO THE INVENTION

1. Field of the Invention

The present invention relates to the reduction of signals of unwanted frequencies in switched mode power supplies in which an error in the selected voltage is corrected. The invention particularly but not exclusively relates to switched mode power supplies for envelope tracking applications such as may be used for radio frequency (RF) amplification.

2. Description of the Related Art

Frequency domain duplex (FDD) systems include transceivers that have a transmitter and a receiver which operate at different carrier frequencies. A simple exemplary architecture of such an FDD system is illustrated in FIG. 1. A transceiver includes a transmitter block 6 which receives an input signal on line 2 to be transmitted by an antenna 18. A receiver block 8 receives signals that are detected at the antenna 18 and delivers them on signal line 4. The output of the transmitter 6 is delivered to a duplex filter 14 on line 10. The received signal from the antenna 18 is delivered from the duplex filter 14 on a line 12 to the receiver 8. The antenna 18 is connected to the duplex filter 14 via a line 16.

In such an FDD system it is important that energy from the transmitter does not block the receiver. This blocking may occur because the duplex filter on the output of the transmitter has only limited attenuation. Any noise present at the receiver frequency on the transmitter output, due to noise from the transmitter, has the potential to cause receiver blocking.

It is an aim of the invention to provide an improved technique for reducing the noise generated by a switched mode power supply.

SUMMARY OF THE INVENTION

In accordance with the invention there is provided a switched mode power supply arranged to provide a switched supply at one terminal of an inductor, another terminal of the inductor being connected to a first input of an error amplifier having a reference signal at a second input, the error amplifier generating a corrected switched supply at an output in dependence on the difference between signals at its first and second inputs, there being provided a feedback path between the output of the error amplifier and the first input of the error amplifier, and further comprising circuitry for sensing a switcher interference current in the feedback path of the error amplifier, and for adjusting the corrected switched supply output to reduce the switcher interference current in the output. The circuitry may comprise coupling between the output of the error amplifier and the feedback path. The circuitry preferably comprises an impedance between the output of the error amplifier at the feedback path.

In a preferred arrangement an envelope tracking power supply comprises a switched mode power supply arranged to provide a switched supply output in dependence upon a reference signal. The output of the switched mode power supply is preferably connected to a first terminal of an inductor. A second terminal of the inductor is connected to a first terminal of an impedance and a first input of an error amplifier. The second input of the error amplifier is connected to the reference signal. The second terminal of the impedance is connected to the output of the error amplifier.

A corrected version of the output of the switched mode power supply which more closely tracks the reference signal is generated at the output of the error amplifier.

An RF amplification stage preferably includes such an envelope tracking power supply. The reference signal is generated in dependence on the envelope of an input signal to be amplified. The corrected switched supply provided at the output of the error amplifier forms the power supply for an RF power amplifier, which generates an amplified output voltage based on the input voltage at its output.

In all embodiments the inductor may be connected to an input of the error amplifier via additional feedback circuitry. This may depend, for example, upon whether the input to the error amplifier to which the inductor is connected is an inverting input or a non-inverting input.

The error amplifier has a transconductance of $g_m$. In a preferred embodiment the impedance has a value of $1/g_m$. An increase in the voltage at the feedback input of the error amplifier due to increased current in the inductor caused by interference, is therefore cancelled by an opposite reduction in voltage of the output of the error amplifier due to the presence of the impedance.

The switched mode power supply may further comprise a resistor connected in the feedback path between the output of the error amplifier and the first input, and an inductor connected between the first input and the output of the error amplifier at the feedback path.

Such an arrangement provides preferable second order cancellation.

The impedance preferably comprises a reactive element. The impedance may be implemented as a printed circuit board track. The printed circuit board track may be arranged to have a particular length and width in order to provide the necessary impedance.

BRIEF DESCRIPTION OF THE FIGURES

The invention is now described with reference to the following figures, in which.

DESCRIPTION OF THE PREFERRED EMBODIMENT

In the following description the invention is described with reference to exemplary embodiments and implementations. The invention is not limited to the specific details of any arrangements as set out, which are provided for the purposes of understanding the invention.

In particular the invention is described in the context of an implementation of a switched mode power supply in an envelope tracking power supply for an RF power amplifier. The invention however is not limited to an envelope tracking power supply or an RF power implementation.

Figure 2:
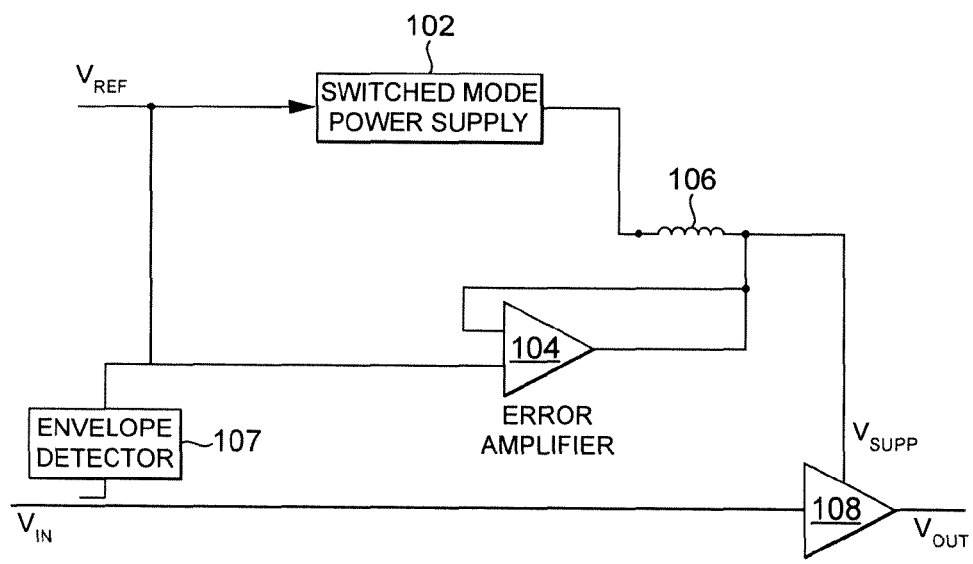
FIG. 2 illustrates an exemplary envelope tracking power supply.

FIG. 2 illustrates the architecture of an exemplary amplification stage including an envelope tracking power supply which may be implemented in an FDD transmitter. The purpose of the amplification stage is to develop an amplified version of an input voltage $V_{IN}$ as an output voltage $V_{OUT}$. A reference voltage $V_{REF}$ represents the amplitude of the input signal $V_{IN}$ and is used to generate a supply voltage $V_{SUPP}$ for delivery to a load, comprising an RF power amplifier 108. The output signal $V_{OUT}$ is intended to be an amplified replica of the input voltage $V_{IN}$.

An envelope detector 107 receives the input voltage $V_{IN}$ and generates the reference voltage $V_{REF}$ representing the envelope of the input signal. A switched mode power supply 102 receives the reference signal $V_{REF}$, and generates an output supply from one of multiple available supply voltages, in dependence on which most closely matches the instantaneous value of the reference signal $V_{REF}$. The selected supply voltage is applied to a first terminal of an inductor 106, and an output supply current is generated at the second terminal of the inductor.

The switched mode power supply 102 is an efficient supply, but only coarsely tracks the reference signal $V_{REF}$ at its input. To provide a more accurate tracked signal, an error amplifier 104 is provided to remove an error in the selected switched supply and provide a corrected switched supply output. In the simple illustrated architecture, the error amplifier receives the reference signal $V_{REF}$ at one input, and the output of the error amplifier 104 at the other input. The output of the error amplifier 104 is also connected to the second terminal of the inductor 106. The error amplifier 104 is a voltage to current converting amplifier, and injects a current at the second terminal of the inductor 106 which represents the error between the signal at the second terminal of the inductor 106 and the reference signal.

The thus adjusted (or corrected) output current at the second terminal of the inductor 106 is delivered to the power supply terminal of the RF power amplifier 108, and the voltage signal $V_{OUT}$ is developed at the output of the amplifier 108.

It will be appreciated that FIG. 2 represents an exemplary architecture to illustrate the principle of an envelope tracking switched mode power supply for an RF amplifier, and additional circuitry may be required for an actual implementation.

The switches of the switched mode power supply 102 enable the delivery of most of the envelope power of the voltage supply signal by efficient means through the inductor 106. The error amplifier 104 provides fine control at the output of the switched mode power supply, and enables removal of the unwanted injected signals through the inductor 106.

An envelope tracking system such as illustrated in FIG. 2 generates unwanted noise by using a switched mode power supply for efficiency, and this can generate noise over a broad spectrum. The output noise specification of a given system may be breeched if this noise appears on the output power supply.

The output impedance of the error amplifier 104 is the reciprocal of the transconductance, $g_m$, of the error amplifier 104, i.e. $1/g_m$. This output impedance defines the limit of the suppression of the unwanted interferer, because an unwanted voltage is developed across the load (i.e. the power amplifier 108) that is $I_r/g_m$, where $I_r$ is the current associated with the unwanted interference.

One way to reduce this voltage would be to increase $g_m$. However a need to maintain sufficient stability margins at high frequencies limits the ability to increase $g_m$.

In accordance with the invention, it is recognised that an increase in current from the switched mode power supply 102 into the first terminal of inductor 106 due to unwanted interference requires an increase in the current flow into the error amplifier 104 of the same amount if the effect of the interference is to be cancelled.

In order to provide this increase, the feedback input terminal to the error amplifier 104 must rise by a voltage $a/g_m$, where a is the interference current flowing from the second terminal of the inductor 106. This voltage appears at the supply output as an interference error.

Figure 1:
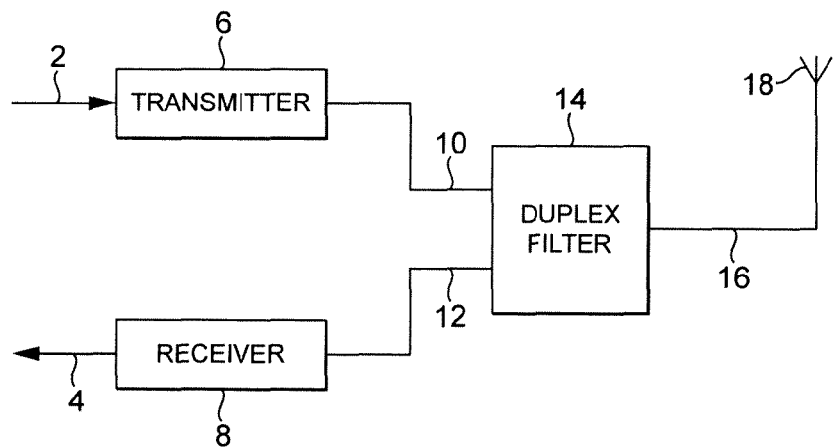
FIG. 1 illustrates the front-end of an exemplary FDD transceiver.
Figure 3:
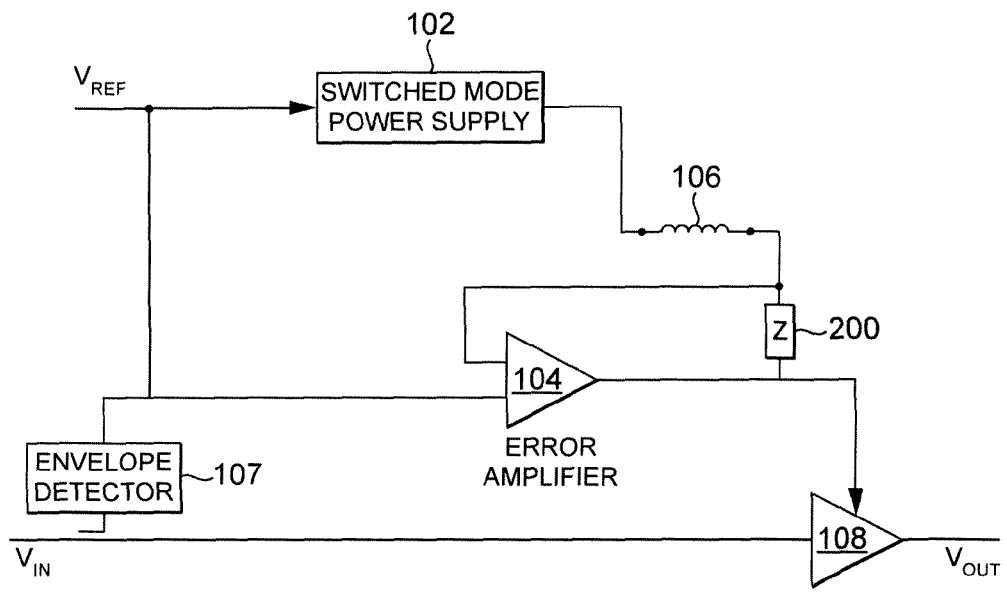
FIG. 3 illustrates an improvement to the arrangement of FIG. 2 in accordance with an embodiment of the invention.

With reference to FIG. 3, there is illustrated the exemplary arrangement of FIG. 1 modified in accordance with the invention, to include circuitry for sensing a switcher interference current in the feedback path of the error amplifier, and for adjusting the corrected switched supply output to reduce the switcher interference current in the output. This circuitry preferably comprises coupling between the output of the error amplifier and the feedback path. The circuitry is preferably an additional impedance 200 having a value Z.

As shown in FIG. 3, the feedback path to the error amplifier 104 is taken from the second terminal of the inductor 106. The impedance 200 is connected between the output of the error amplifier and the second terminal of the inductor. The impedance 200 thus has a first terminal connected to the output of the error amplifier 104, and a second terminal connected to the second terminal of the inductor 106.

The feedback path is connected between the second terminal of the inductor 106/second terminal of the impedance 200, and the feedback input to the error amplifier 104. The output providing the supply voltage to the power amplifier is provided by the output of the error amplifier 104/first terminal of the impedance 200.

The value of the impedance Z is set at $1/g_m$, where $g_m$ is the transconductance of the error amplifier 104.

The provision of the impedance 200 provides a reduction in the unwanted interference provided in the output supply to the amplifier 108 without any compromise to the amplifier stability margin.

In the arrangement of FIG. 3, the voltage at the feedback input to the error amplifier 104 increases by $a/g_m$, as described above.

However the output side of impedance 200 (the first terminal of 200) simultaneously falls by an amount $a/g_m$ below this.

This means that the output signal generated for the amplifier 108 (in the load) remains constant irrespective of the interference current flowing through the switched voltage supply 102.

The invention therefore does not stop the error amplifier generating the signal including the unwanted interference, but provides an opposite signal which cancels it.

The transconductance $g_m$ of the error amplifier 104 may be frequency dependent. Therefore the impedance 200 is preferably adapted to track this variation in transconductance over frequency, and suitably adjust its value Z. Typically for a single-pole compensated system $g_m$ falls at a rate of 6 dB per octave, meaning that $1/g_m$ rises at 6 dB per octave, i.e. it looks inductive. This means the impedance 200 should preferably be small and inductive. It will then efficiently track the variations due to frequency. For example, the impedance may be implemented as a chip inductor to track transconductance variation due to frequency.

Figure 4:
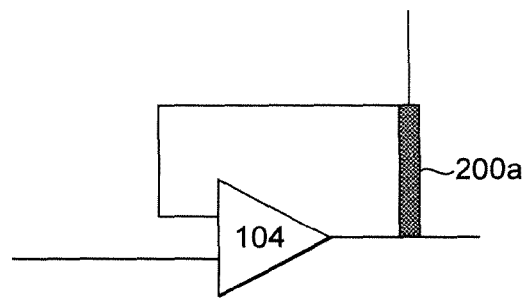
FIG. 4 illustrates an implementation of the improvement of FIG. 3.

This characteristic of the impedance 200 may also be achieved by implementing the impedance as a length of track. This is illustrated in FIG. 4, where the impedance is shown as a length of track 200a implemented at a particular length and width. Thus the feedback is not taken directly from the error amplifier, but is taken from a length of track that has an impedance equal to $1/g_m$ of the active circuit comprising the error amplifier.

If the error amplifier is second order compensated, then the output impedance of the error amplifier will rise at 12 dB/octave, and therefore it would be desirable to preferably modify the cancellation circuit provided by the impedance 200.

Figure 5:
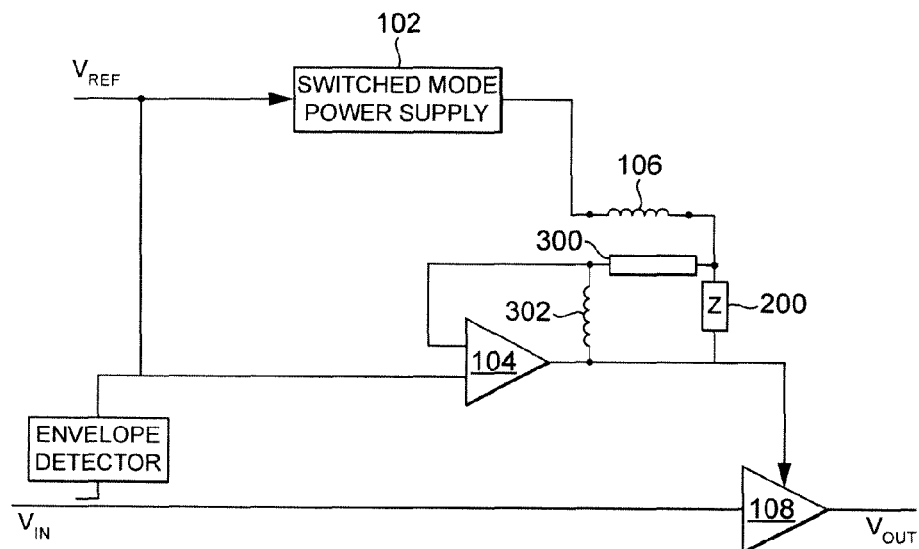
FIG. 5 illustrates a further improvement to the arrangement of FIG. 2.

FIG. 5 shows an alternative arrangement to that of FIG. 3, in which second order cancellation is provided. A resistor 300 is provided in the feedback circuit between the common connection of the inductor 106 and impedance 200 and the input to the error amplifier 104. A reactive element, in FIG. 5 an inductor 302, is connected between the terminal of the resistor 300 which connects to the input of the error amplifier 104 and the output of the error amplifier 104. The resistor 300 and reactive element 302 provide second order cancellation in addition to the primary cancellation provided by the arrangement of FIG. 3.

Figure 6:
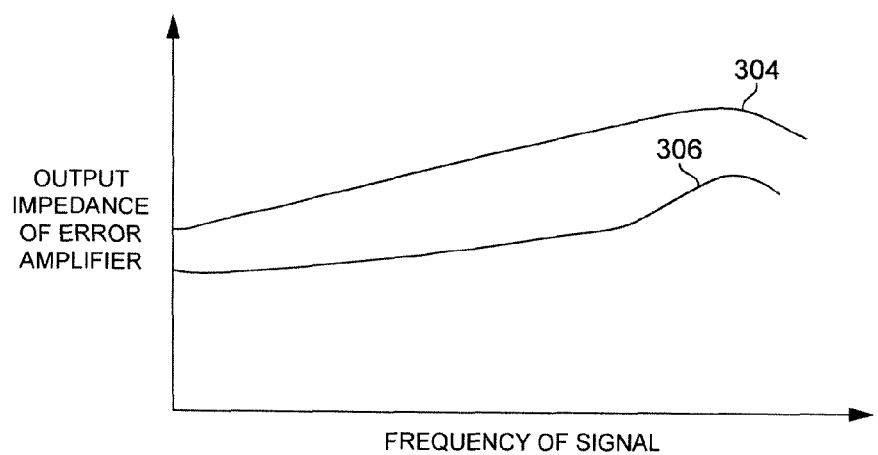
FIG. 6 illustrates a typical improvement which may be obtained in embodiments of the invention.

FIG. 6 shows the effect of the cancellation provided by the invention. FIG. 6 is a plot of the output impedance of the error amplifier against the frequency of the signal provided to the error amplifier. The plot 304 illustrates the impedance trajectory of the error amplifier without cancellation in accordance with the embodiments of the invention. The waveform 306 illustrates the impedance trajectory of the amplifier with cancellation in accordance to the arrangement of FIG. 3. As can be seen, the effective output impedance of the error amplifier is reduced as a result of cancellation provided by the impedance 200.

The invention may generally be implemented as part of a switched mode power supply, an envelope tracking power supply, as an RF amplification stage incorporating an envelope tracking power supply.

Such implementations have particular activity in mobile communication systems, particularly mobile or portable handset devices, but also in mobile communication infrastructure.

The invention has been described herein by way of example with reference to embodiments. The invention is not limited to the described embodiments, nor to specific combinations of features in embodiments. Modifications may be made to the embodiments within the scope of the invention. The scope of the invention is defined by the appended claims.

What is claimed is:

1. A switched mode power supply comprising:
a first inductor arranged to receive a switched supply at one terminal;
an error amplifier having a first input connected to an other terminal of the first inductor and a second input connected to a reference signal, the error amplifier being configured to generate a corrected switched supply at an output of the error amplifier in dependence on a difference between signals at the first and second inputs;
an impedance connected between the output of the error amplifier and the other terminal of the first inductor;
a resistor connected between the other terminal of the first inductor and the first input of the error amplifier; and
a second inductor connected between the first input of the error amplifier and the output of the error amplifier.

2. The switched mode power supply of claim 1, wherein the impedance has a value of $1/g_m$, where $g_m$ is the transconductance of the error amplifier.

3. The switched mode power supply of claim 1, wherein the impedance comprises a reactive element.

4. The switched mode power supply of claim 1, wherein the impedance is implemented as a printed circuit board track.

5. An envelope tracking power supply including the switched mode power supply of claim 1.

6. A radio frequency (RF) amplification stage including the switched mode power supply according to claim 1 for providing a power supply to an RF power amplifier.

* * * * *